United States Patent
Tsai et al.

(10) Patent No.: US 9,496,385 B2
(45) Date of Patent: Nov. 15, 2016

(54) STRUCTURE AND METHOD OF FORMING SEMICONDUCTOR DEVICE

(71) Applicant: Taiwan Semiconductor Manufacturing Company, Ltd., Hsin-Chu (TW)

(72) Inventors: Chun Hsiung Tsai, Hsinchu County (TW); Tsan-Chun Wang, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/468,480

(22) Filed: Aug. 26, 2014

(65) Prior Publication Data
US 2016/0064549 A1    Mar. 3, 2016

(51) Int. Cl.
*H01L 29/78*    (2006.01)
*H01L 29/66*    (2006.01)

(52) U.S. Cl.
CPC ..... *H01L 29/7813* (2013.01); *H01L 29/66545* (2013.01); *H01L 29/66553* (2013.01); *H01L 29/66727* (2013.01); *H01L 29/66734* (2013.01)

(58) Field of Classification Search
CPC .......... H01L 29/813; H01L 29/66545; H01L 29/66553; H01L 29/66727; H01L 29/66734
USPC ........................................................ 257/298
See application file for complete search history.

(56) References Cited

U.S. PATENT DOCUMENTS

| | | | | |
|---|---|---|---|---|
| 6,420,250 B1 * | 7/2002 | Cho | ................. | H01L 21/28247 257/344 |
| 6,495,889 B1 * | 12/2002 | Takahashi | ......... | H01L 21/76897 257/331 |
| 6,649,490 B1 * | 11/2003 | Lee | .................. | H01L 21/76897 257/E21.507 |
| 6,764,898 B1 * | 7/2004 | En | .................... | H01L 21/28123 257/E21.201 |
| 2008/0237726 A1 * | 10/2008 | Dyer | ............... | H01L 21/823807 257/369 |
| 2012/0187524 A1 * | 7/2012 | Huang | .............. | H01L 21/02321 257/506 |
| 2013/0075826 A1 * | 3/2013 | Xu | ...................... | H01L 29/4966 257/369 |
| 2013/0109145 A1 * | 5/2013 | Mieno | ............... | H01L 29/66545 438/305 |

* cited by examiner

*Primary Examiner* — Kenneth Parker
*Assistant Examiner* — Warren H Kilpatrick
(74) *Attorney, Agent, or Firm* — Haynes and Boone, LLP

(57) ABSTRACT

The present disclosure provides a method for fabricating semiconductor device. The method includes forming a first dielectric layer over a substrate, forming a gate structure over a first portion of the first dielectric layer, forming a sidewall spacer over a second portion of the first dielectric layer and on the gate structure, converting the second portion of the first dielectric layer and an exposed third portion of the first dielectric layer to a first portion of a second dielectric layer and a second portion of the second dielectric layer, respectively, removing the second portion of the second dielectric layer and a portion of the substrate to form a recess in the substrate adjacent the sidewall spacer, forming a source/drain (S/D) feature in the recess and removing the gate electrode and the first portion of the first dielectric layer to form a gate trench.

20 Claims, 7 Drawing Sheets

STRUCTURE AND METHOD OF FORMING SEMICONDUCTOR DEVICE

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. Although existing devices and methods of fabricating devices have been generally adequate for their intended purposes, they have not been entirely satisfactory in all respects, such as robust process integration for gate replacement process flow.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
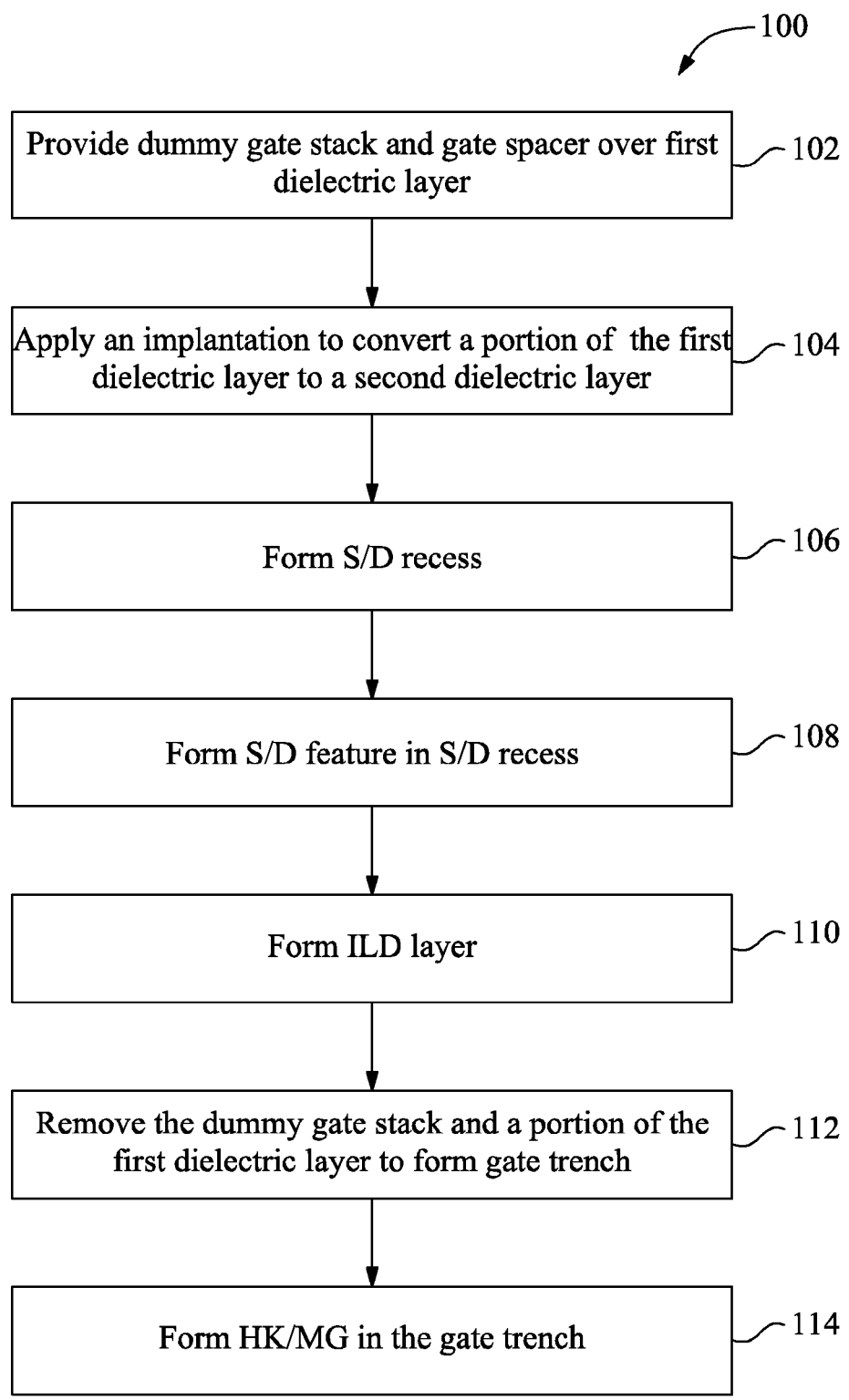
FIG. 1 is a flow chart of an example method for fabricating a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 for fabricating a semiconductor device 200 in accordance with some embodiments. It is understood that additional steps may be implemented before, during, and after the method, and some of the steps described may be replaced or eliminated for other embodiments of the method. The semiconductor device 200 and the method 100 making the same are collectively described with reference to various figures.

Figure 2:
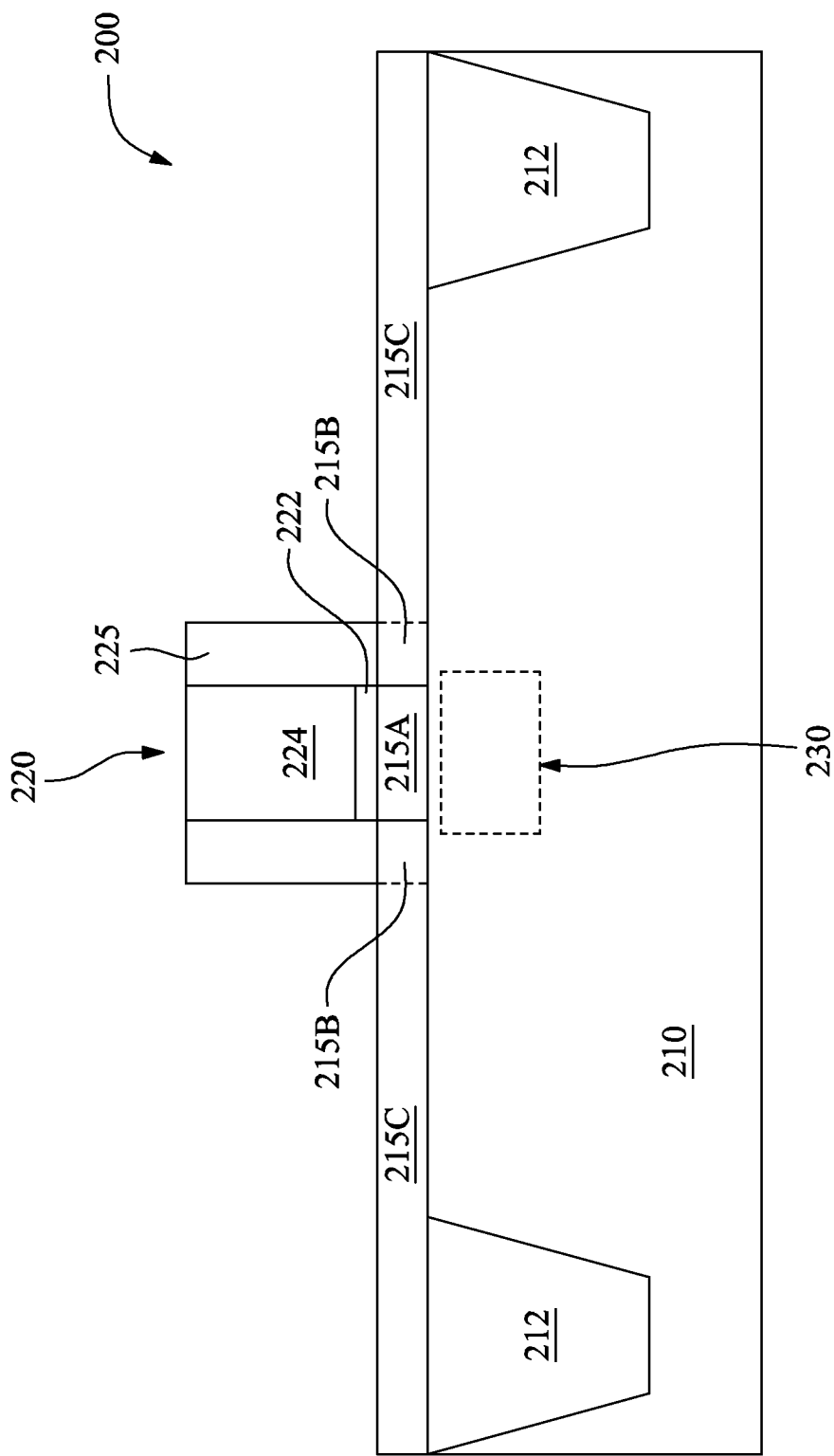
FIGS. 2 to 7 are cross-sectional views of an example semiconductor device in accordance with some embodiments.

Referring to FIGS. 1 and 2, the method 100 begins at step 102 by providing the semiconductor device 200 in an intermediate stage. Semiconductor device 200 includes a substrate 210. The substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide, or combinations thereof. Possible substrates 210 also include a silicon-on-insulator (SOI) substrate. SOI substrates are fabricated using separation by implantation of oxygen (SIMOX), wafer bonding, and/or other suitable methods.

The substrate 210 may include various doped regions (not shown) depending on design requirements as known in the art. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure.

The substrate 210 also includes isolation regions 212 to isolate active regions of the substrate 210. The isolation region 212 may be formed using traditional isolation technology, such as shallow trench isolation (STI), to define and electrically isolate the various regions. The isolation region 212 comprises silicon oxide, silicon nitride, silicon oxynitride, an air gap, other suitable materials, or combinations thereof. The isolation region 212 is formed by any suitable process. As one example, the formation of an STI includes a photolithography process, an etch process to etch a trench in the substrate (for example, by using a dry etching and/or wet etching), and a deposition to fill in the trenches (for example, by using a chemical vapor deposition process) with one or more dielectric materials.

In the present embodiment, a first dielectric layer 215 is formed over the substrate 210. The first dielectric layer 215 may include silicon oxide, silicon nitride, oxynitride, silicon carbide, and/or other suitable materials. In one embodiment, the first dielectric layer 215 is an input/output (I/O) oxide layer. The deposition of the first dielectric layer 215 includes a suitable technique, such as chemical vapor deposition (CVD), physical vapor deposition (PVD) and/or atomic layer deposition (ALD).

A gate stack 220 is formed over the first dielectric layer 215 and a gate spacer 225 along sidewalls of the gate stack 220. The gate stack 220 may include a gate dielectric layer 222 and a gate electrode layer 224. In present embodiment, the gate stack 220 is a dummy gate stack and is replaced later by a high-k/metal gate (HK/MG). The dummy gate stack 220 may include the gate dielectric layer 222 and the polysilicon layer 224. The dummy gate stack 220 can be formed by a procedure including deposition, photolithography patterning, and etching processes. The deposition processes may include CVD, PVD, ALD, or other suitable processes. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods.

The gate spacers 225 include a dielectric material such as silicon oxide. Alternatively, the gate spacers 225 may include silicon nitride, silicon carbide, silicon oxynitride, or combinations thereof. The gate spacers 225 may be formed by depositing a dielectric material over the gate stack 220 and then anisotropically etching back the dielectric material. A region locates underneath the gate stack 220 in the substrate 210 is referred to as a gate region 230.

In the present embodiment, the first dielectric layer 215 interposes between the substrate 210 and the dummy gate stack 220 including the gate spacer 225. For the sake of clarity to better description of concepts of the present disclosure, first dielectric layer 215 is defined as first, second and a third portions. The first portion is underneath the dummy gate stack, referred to as 215A; the second portion is underneath the gate spacer 225, referred to as 215B; and the third portion is outside of the gate spacer 225, referred to as 215C.

Figure 3:
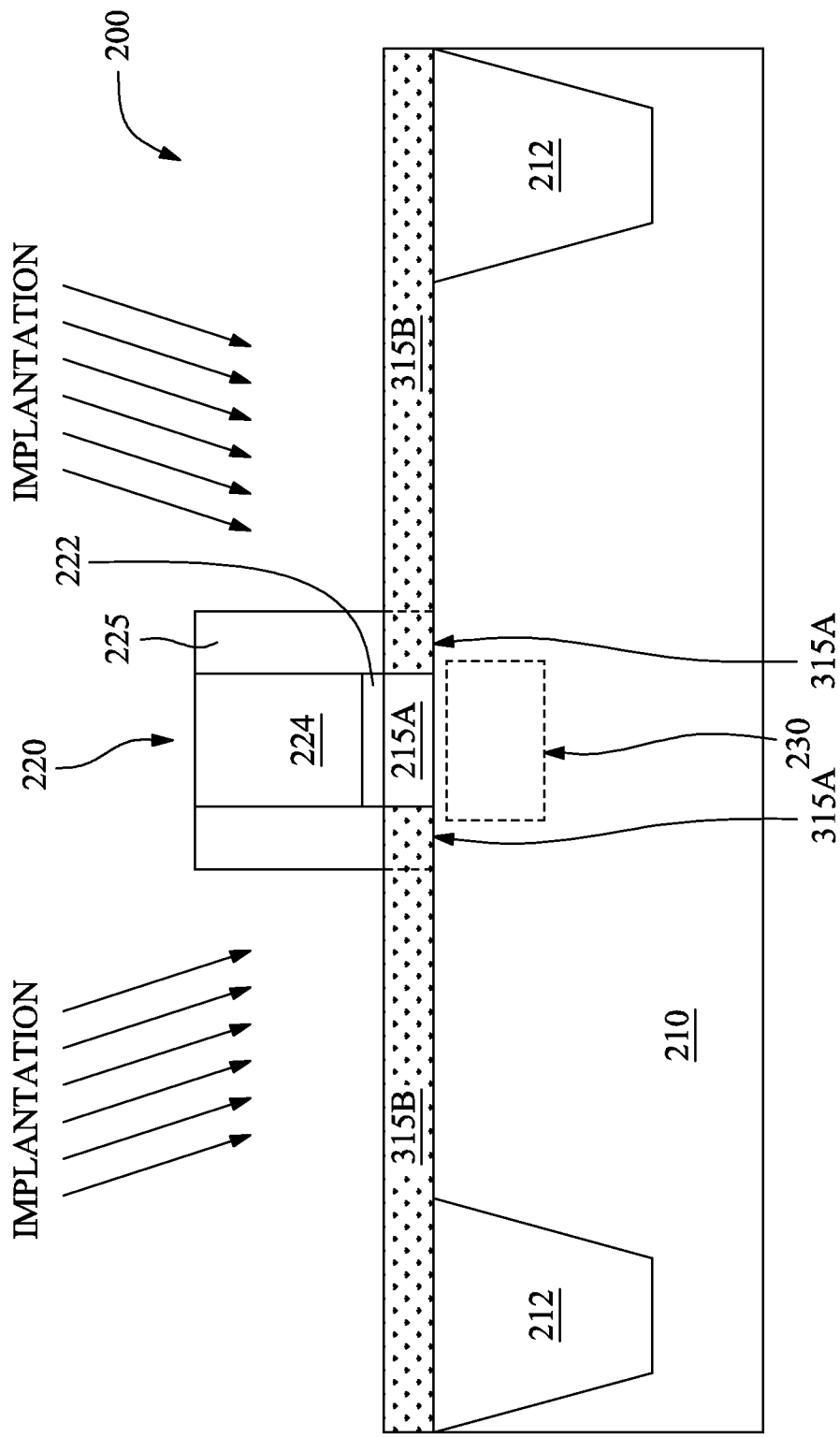

Referring to FIGS. 1 and 3, the method 100 proceeds to step 104 by converting the second and third portions of the first dielectric layer, 215B and 215C, to a second dielectric layer 315, while leaving the first portion of the first dielectric layer 215A intact. The second portion of the first dielectric layer 215B converts to a first portion of the second dielectric layer 315, referred to as 315A, and the third portion of the first dielectric layer 215 converts to a second portion of the second dielectric layer 315, referred to as 315B. In the present embodiment, the second dielectric layer 315 is formed such that it is different from the material of the first dielectric layer 215 and the dummy gate stack 220 to achieve etching selectivity during subsequent etch processes.

In the present embodiment, an ion implantation is applied to convert the second and third portion of the first dielectric layer, 215B and 215C to a dopant-containing dielectric layer 315A and 315B while leaving the first portion of the first dielectric layer 215A intact. The doping species may include carbon, boron, indium, silicon, nitrogen, helium, and/or other suitable dopants.

In one embodiment, the ion implantation process is a tilted ion implantation applied to the first dielectric layer 215 with a tilt angle. The tilt angle of the ion implantation process is designed such that the second and third portions of the first dielectric layer 215B and 215C are converted to the dopant-containing dielectric layer.

For example, in one embodiment, the first dielectric layer 215 includes silicon oxide and the doping species includes carbon such that the second and third portion of the first dielectric layer, 215B and 215C, are converted to the carbon-containing silicon oxide layer 315 by carbon implantation. As an example, a carbon implantation is applied to convert the form portion of the silicon oxide layer 215 to silicon carbide oxide layer 315, with an energy range from 0.5 Kev to 2 Kev, a dopant concentration range from $1.0 \times 10^{14}/cm^3$ to $2.0 \times 10^{15}/cm^3$ and a tilt angle range from zero degree to 25 degree. In one embodiment, the ion implantation is applied with sharing a hard mask for lightly doped (LDD) process.

Figure 4:
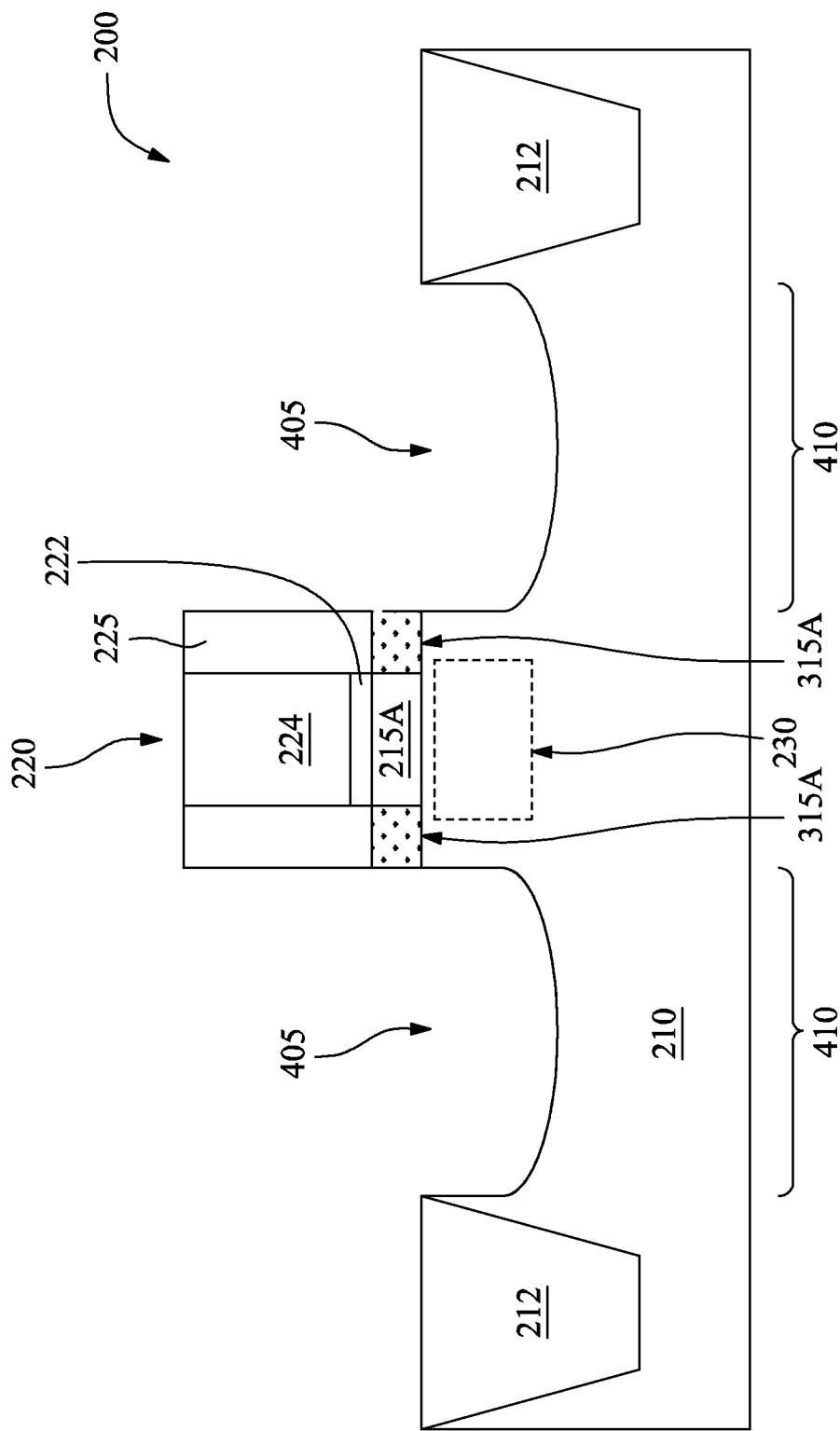

Referring to FIGS. 1 and 4, the method 100 proceeds to step 106 by removing the second portion of the second dielectric layer 315B and forming source/drain (S/D) recesses 405 in S/D regions 410 at either sides of the dummy gate stack 220. The etching process may include dry etching process, wet etching process, and/or combination thereof. The recessing process may also include a selective wet etch or a selective dry etch. A wet etching solution includes a tetramethylammonium hydroxide (TMAH), a HF/HNO$_3$/CH$_3$COOH solution, or other suitable solution. The dry etching process may implement fluorine-containing gas (e.g., CF$_4$, SF$_6$, CH$_2$F$_2$, CHF$_3$, and/or C$_2$F$_6$), chlorine-containing gas (e.g., Cl$_2$, CHCl$_3$, CCl$_4$, and/or BCl$_3$), bromine-containing gas (e.g., HBr and/or CHBR$_3$), iodine-containing gas, other suitable gases and/or plasmas, and/or combinations thereof. The etching process may include a multiple-step etching to gain etch selectivity, flexibility and desired etch profile. The first portion of the second dielectric layer 315A remains intact. In the present embodiment, the S/D recesses 405 are formed in source/drain (S/D) regions 410, such that the gate stack 220 interposes the recesses 405.

Figure 5:
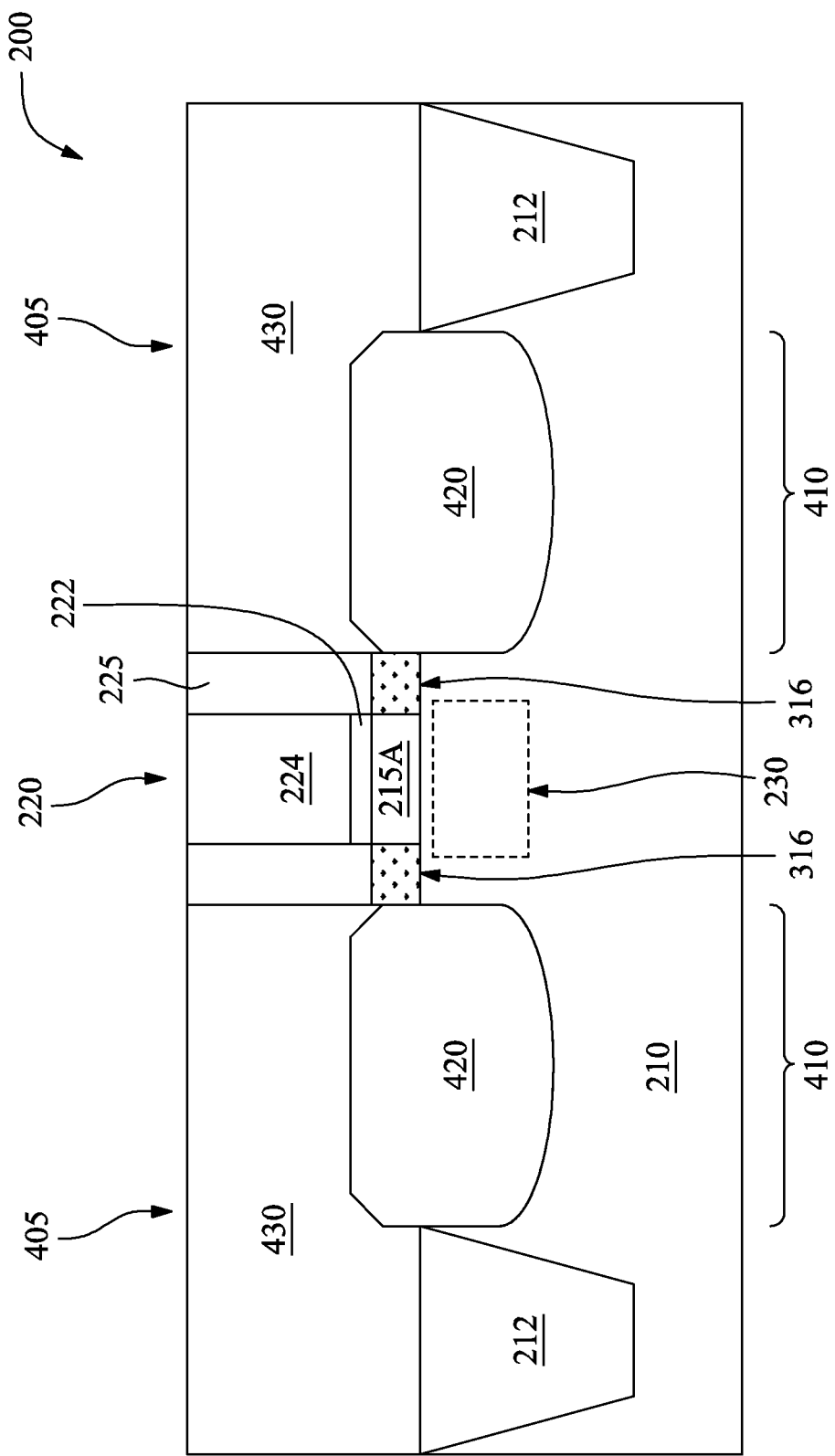

Referring to FIGS. 1 and 5, the method 100 proceeds to step 108 by forming S/D features 420 over the S/D recesses 405. The S/D features 420 are formed by epitaxially growing the semiconductor material layer on the S/D recesses 405. In one embodiment, prior to epitaxially growing process, a wet etching process is performed to remove any native oxide formed over the S/D recess 405. In the present embodiment, the first portion of the second dielectric layer 315A is formed to have high etch resistance to the wet etching process and serves as an etch-stop-block (ESB) to avoid undercut towards the dummy gate stack 220, during the wet etching process. Thus, the first portion of the second dielectric layer 315A is also referred to as ESB 316.

The epitaxial processes may include CVD deposition techniques (e.g., vapor-phase epitaxy (VPE) and/or ultra-high vacuum CVD (UHV-CVD)), molecular beam epitaxy, and/or other suitable processes. The S/D features 420 may be formed by one or more epitaxy or epitaxial (epi) processes. The S/D features 420 may be in-situ doped during the epi process. For example, the epitaxially grown SiGe source/drain features 420 may be doped with boron; and the epitaxially grown Si epi source/drain features 420 may be doped with carbon to form Si:C source/drain features, phosphorous to form Si:P source/drain features, or both carbon and phosphorous to form SiCP source/drain features. Alternatively, the S/D features 420 are not in-situ doped, an ion implantation process (i.e., a junction implant process) is performed to dope the S/D features 420, such as GeSnz, SiGeSnz, SiGeSnzB, or GeSnzB. One or more annealing processes may be performed to activate source/drain epitaxial feature. The annealing processes comprise rapid thermal annealing (RTA) and/or laser annealing processes.

The S/D feature 420 may include germanium (Ge), silicon (Si), gallium arsenide (GaAs), aluminum gallium arsenide (AlGaAs), silicon germanium (SiGe), gallium arsenide phosphide (GaAsP), silicon germanium tin (SiGeSn), and/or other suitable materials. The S/D feature 420 may include multiple semiconductor material layers. After the S/D recess 405 are filled with the S/D feature 420, the further epitaxial growth of the top layer of the S/D feature 420 expands horizontally and facets may start to form, such as a diamond shape facets. In present embodiment, a lower portion of the S/D feature 420 is embedded in the substrate 210 and an upper portion of the S/D feature 420 is above the substrate 210 and it is separated from the dummy gate stack by the ESB 316.

The S/D feature 420 may be in-situ doped during the epi processes. For example, the epitaxially grown SiGe feature 420 may be doped with boron; and the epitaxially grown Si epi feature 420 may be doped with carbon to form Si:C S/D feature 420, phosphorous to form Si:P S/D feature 420, or both carbon and phosphorous to form SiCP S/D feature 420. In one embodiment, the S/D feature 420 is not in-situ doped, an ion implantation process (i.e., a junction implant process) is performed to dope the S/D feature 420.

Referring again to FIGS. 1 and 5, the method 100 proceeds to step 110 by depositing an interlayer dielectric (ILD) layer 430 over the substrate 210, including between the dummy gate stacks 220. The ILD layer 430 may include silicon oxide, oxynitride or other suitable materials. The ILD layer 430 may include a single layer or multiple layers. The ILD layer 430 is formed by a suitable technique, such as CVD, ALD and spin-on (SOG). A chemical mechanical polishing (CMP) process may be performed to remove excessive ILD layer 430 and planarize the top surface of the ILD layer 430 with the dummy gate stack 220.

Figure 6:
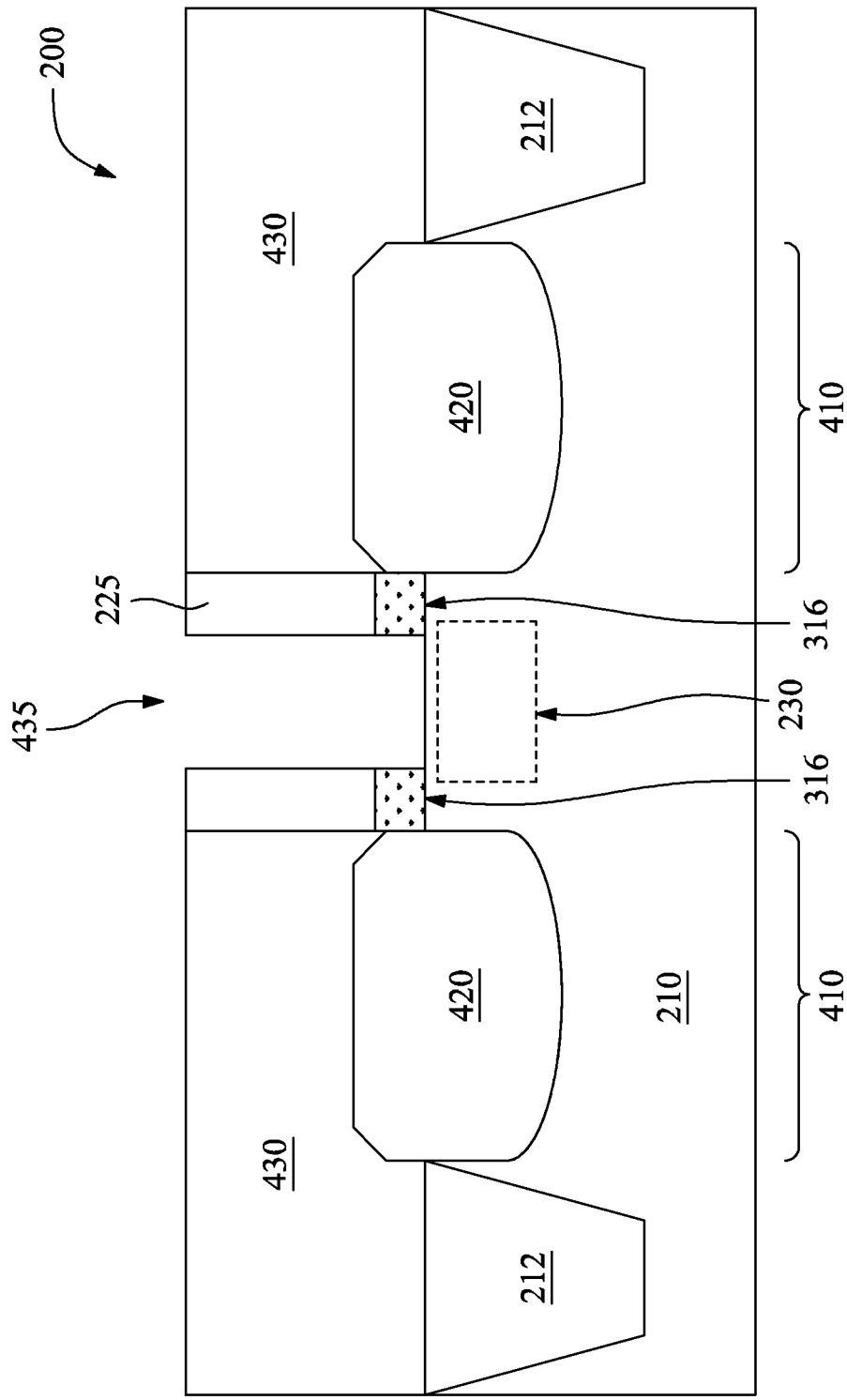

Referring also to FIGS. 1 and 6, the method 100 proceeds to step 112 by removing the dummy gate stack 220 and the first portion of the first dielectric layer 215A to form a gate trench 435. In one embodiment, the dummy gate stack 220 and the first portion of the dielectric layer 215A are removed by a selective wet etch, or a selective dry etch. In one embodiment, the dummy gate stack 220 is removed by a wet etching solution includes a tetramethylammonium hydroxide (TMAH), a HF/HNO$_3$/CH$_3$COOH solution, or other suitable solution. Thus a surface of the ESB 316 is laterally exposed in the gate trench 435.

As mentioned previously, the ESB 316 is formed to have high etch resistance during removing the dummy gate stack 220 and the first portion of the first dielectric layer 215A. Thus, ESB 316 serves as an etch stop block to prevent adverse impact during removing the dummy gate stack 220 and the first portion of the first dielectric layer 215A. For example, without ESB 316 being present, during the gate replacement process a pathway may be formed that extends from gate trench 435 to the S/D feature 420. Such a pathway is undesirable because it allows subsequent etching solution to leak through the pathway and etch the S/D feature 420 thereby forming voids in the S/D feature 420. The ESB 316 feature described herein helps prevent such a pathway from being formed.

Figure 7:
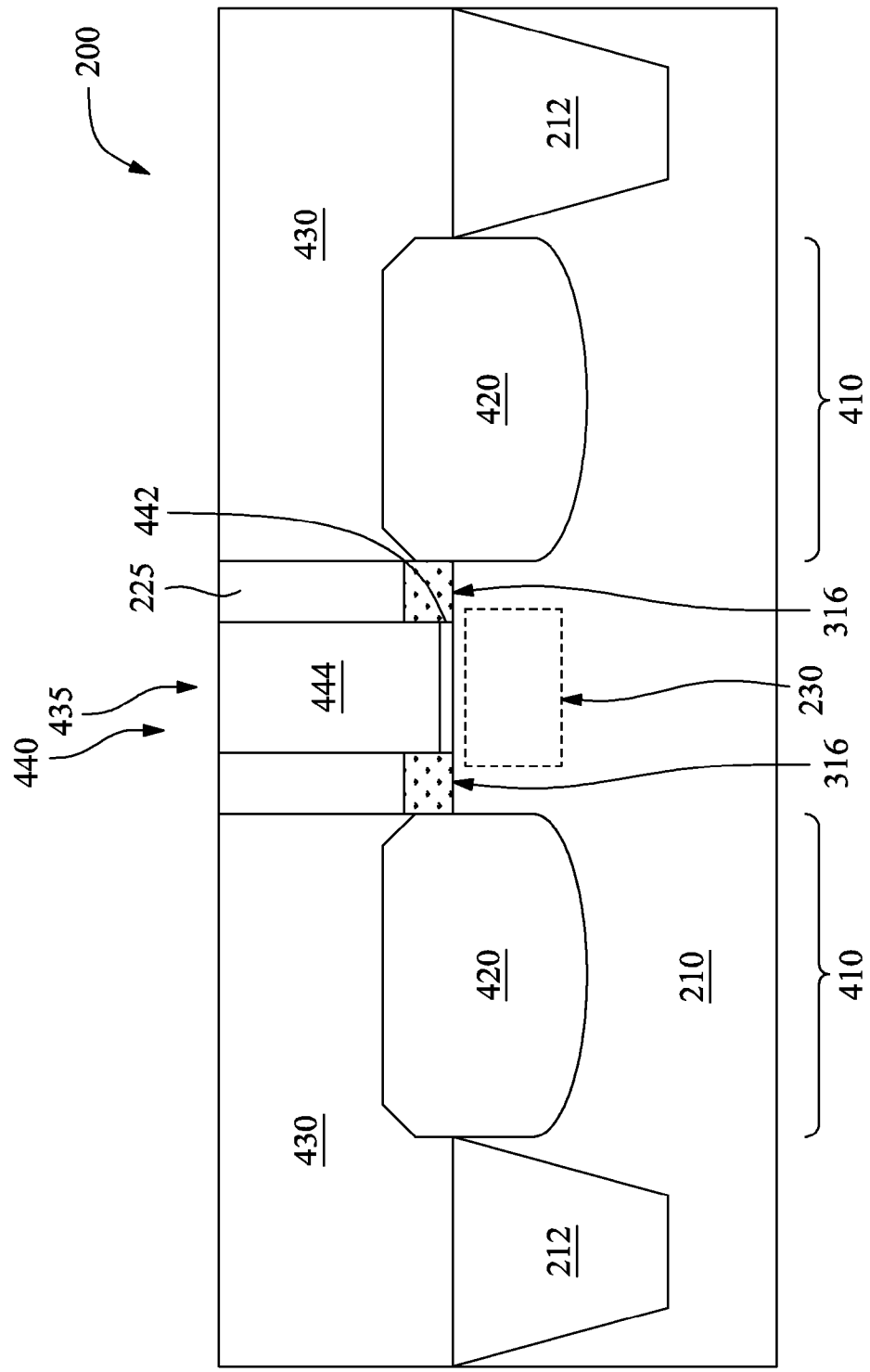

Referring also to FIGS. 1 and 7, the method 100 proceeds to step 114 by forming a high-k/metal gate (HK/MG) 440 in the gate trench 435. The HK/MG 440 includes a gate dielectric layer 442 and a MG electrode 444. The gate dielectric layer 442 is deposited over the gate trench 435. In one embodiment, the gate dielectric layer 442 may include the interfacial layer (IL) and the HK dielectric layer. The IL may include oxide, HfSiO and oxynitride deposited by a suitable method, such as atomic layer deposition (ALD), CVD, thermal oxidation or ozone oxidation. The HK dielectric layer may include LaO, AlO, ZrO, TiO, Ta$_2$O$_5$, Y$_2$O$_3$, SrTiO$_3$ (STO), BaTiO$_3$ (BTO), BaZrO, HfZrO, HfLaO, HfSiO, LaSiO, AlSiO, HfTaO, HfTiO, (Ba,Sr)TiO$_3$ (BST), Al$_2$O$_3$, Si$_3$N$_4$, oxynitrides (SiON), or other suitable materials. The HK dielectric layer is deposited on the IL by a suitable technique, such as ALD, CVD, metal-organic CVD (MOCVD), physical vapor deposition (PVD), other suitable technique, or a combination thereof.

The MG electrode 444 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode 444 may include Ti, Ag, Al, TiAlN, TaC, TaCN, TaSiN, Mn, Zr, TiN, TaN, Ru, Mo, Al, WN, Cu, W, any suitable materials or a combination thereof. The MG electrode 444 may be formed by ALD, PVD, CVD, or other suitable process. A CMP process may be performed to remove excessive HK dielectric layer 442 and the MG electrode 444 and planarize a surface of the HK/MG 440 with the ILD layer 430.

In the present embodiment, a lower portion of the HK/MG 440 physically contacts the ESB 316. In one embodiment, the lower portion of the HK/MG 440 includes the gate dielectric layer 442 and a portion of the MG electrode 444. As mentioned previously, the ESB 316 prevents a path from being formed from the gate trench 435 to the S/D feature 420 and therefore prevents the MG electrode 444 from contacting the S/D feature 420 through the path which would cause an electrical short.

Additional operations may be implemented before, during, and after the method 800, and some operations described above may be replaced or eliminated for other embodiments of the method 100.

The semiconductor device 200 may undergo further CMOS or MOS technology processing to form various features and regions known in the art. For example, subsequent processing may form various contacts/vias/lines and multilayers interconnect features (e.g., metal layers and interlayer dielectrics) on the substrate 210, configured to connect the various features to form a functional circuit that includes one or more FinFET field-effect transistors. In furtherance of the example, a multilayer interconnection includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, the present disclosure offers a method and a structure for fabricating a semiconductor device. The method employs forming an etch-stop-block (ESB) underneath the gate spacer to separate the gate stack to the S/D feature. The ESB blocks adverse interactions from both sides to each other during several etching processes. The method employs an ion implantation with a tilt angle to form the ESB. The method and the ESB structure demonstrate a robust process integration and device performance improvement.

The present disclosure provides many different embodiments of a method of fabricating semiconductor device. The method includes forming a first dielectric layer over a substrate, forming a gate structure over a first portion of the first dielectric layer, wherein the gate structure includes a gate electrode, forming a sidewall spacer over a second portion of the first dielectric layer and on the gate structure, converting the second portion of the first dielectric layer and an exposed third portion of the first dielectric layer to a first portion of a second dielectric layer and a second portion of the second dielectric layer, respectively. The second dielectric layer is different than the first dielectric layer. The method also includes removing the second portion of the second dielectric layer and a portion of the substrate to form a recess in the substrate adjacent the sidewall spacer, forming a source/drain (S/D) feature in the recess and removing the gate electrode and the first portion of the first dielectric layer to form a gate trench. Therefore the first portion of the second dielectric layer prevents lateral etch towards the S/D feature during the removing of the gate electrode and the first portion of the first dielectric layer.

In another embodiment, a method for fabricating a semiconductor device includes providing a silicon oxide layer interposed between a substrate and a dummy gate stack having a gate spacer along sidewalls. The silicon oxide layer has three portions: a first portion which is underneath the dummy gate stack; a second portion which is underneath the gate spacer and a third portion which is outside of the gate spacer and the dummy gate stack. The method also includes ion implanting species into the second and third portions of the silicon oxide layer to increase it etching resistance to oxide etching process. After receiving the ion implantation, the method also includes etching the third portion of the silicon oxide layer and extending to etch the substrate underneath of it to form a source/drain (S/D) recess, forming a source/drain (S/D) feature in the S/D recess and continually forming the S/D feature above the substrate and removing the dummy gate stack and the first portion of the silicon oxide layer, which does not receive the ion implantation, with a high etch selectivity to the second portion of the silicon oxide, which receives the ion implantation, to form a gate trench.

In yet another embodiment, a semiconductor device includes a high-k/metal gate (HK/MG) over a substrate, a spacer along sidewall of the HK/MG, a dielectric layer interposes between the spacer and the substrate. Therefore a lower portion of the HK/MG physically contacts the dielectric layer. The device also includes a source/drain (S/D) feature is beside of the HK/MG such that an upper portion of the S/D feature is above the substrate and a lower portion of the S/D feature in embedded in the substrate. Therefore the dielectric layer interposes between the upper portion of the S/D feature and the HK/MG.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first dielectric layer over a substrate;
    forming a gate structure over a first portion of the first dielectric layer, wherein the gate structure includes a gate electrode;
    forming a sidewall spacer over a second portion of the first dielectric layer and on the gate structure;
    converting the second portion of the first dielectric layer and an exposed third portion of the first dielectric layer to a first portion of a second dielectric layer and a second portion of the second dielectric layer, respectively, wherein the second dielectric layer is more etch resistant than the first dielectric layer;
    removing the second portion of the second dielectric layer and a portion of the substrate to form a recess in the substrate adjacent the sidewall spacer;
    forming a source/drain (S/D) feature in the recess; and
    removing the gate electrode and the first portion of the first dielectric layer to form a gate trench, wherein the first portion of the second dielectric layer prevents lateral etch towards the S/D feature during the removing of the gate electrode and the first portion of the first dielectric layer.

2. The method of claim 1, wherein converting the second portion of the first dielectric layer and the exposed third portion of the first dielectric layer to the first portion of the second dielectric layer and the second portion of the second dielectric layer, respectively, includes performing an implantation process that incorporates a dopant into the second and third portions of the first dielectric layer.

3. The method of claim 2, wherein the first portion of the first dielectric layer remains intact during the ion implantation.

4. The method of claim 2, further comprising, applying the ion implantation with a species including one or more from the group consisting of carbon, boron, indium, silicon, nitrogen and helium.

5. The method of claim 4, further comprising, applying a carbon implantation to the second and third portion of the silicon oxide layer to convert them to carbon-containing silicon oxide layer.

6. The method of claim 2, further comprising, applying the ion implantation with a tilt angle to convert the second portion of the first dielectric layer into the second dielectric layer.

7. The method of claim 1, further comprising:
    prior to forming the S/D feature in the S/D recess, applying a wet etching process to remove native oxide in the S/D recess.

8. The method of claim 7, wherein the second dielectric layer is formed to have a higher etching resistance to the wet etching process than the first dielectric layer.

9. The method of claim 1, further comprising:
    forming a high-k/metal gate in the gate trench.

10. The method of claim 1, wherein the first dielectric layer includes silicon oxide layer.

11. A method for forming a semiconductor device comprises:
    providing a silicon oxide layer interposed between a substrate and a dummy gate stack having a gate spacer along sidewalls, the silicon oxide layer has three portions:
        a first portion which is underneath the dummy gate stack;
        a second portion which is underneath the gate spacer; and
        a third portion which is outside of the gate spacer and the dummy gate stack;
    applying an ion implantation to the second and third portions of the silicon oxide layer to convert them to a dopant-containing silicon oxide layer to increase an etching resistance of the dopant-containing silicon oxide layer to an oxide etching process;
    after receiving the ion implantation, etching the third portion of the silicon oxide layer and extending to etch the substrate underneath of it to form a source/drain (S/D) recess;
    forming a source/drain (S/D) feature in the S/D recess and continually forming the S/D feature above the substrate; and
    removing the dummy gate stack and the first portion of the silicon oxide layer, which does not receive the ion implantation, with a high etch selectivity to the second portion of the silicon oxide, which receives the ion implantation, to form a gate trench.

12. The method of claim 11, wherein the first portion of the silicon oxide layer remains intact during the ion implantation.

13. The method of claim 11, further comprising, applying the ion implantation with a species including one or more from the group consisting of carbon, boron, indium, silicon, nitrogen, helium.

14. The method of claim 13, further comprising, applying a carbon implantation to the second and third portion of the silicon oxide layer to convert them to carbon-containing silicon oxide layer.

15. The method of claim 11, further comprising, applying the ion implantation with a tilt angle to ion implant the second portion of the silicon oxide layer.

16. The method of claim 11, further comprising:
    prior to forming the S/D feature, applying a wet etching process to remove native oxide in the S/D recess.

17. The method of claim 16, wherein after receiving the ion implantation, the second portion of the silicon oxide layer has a higher etching resistance to the wet etching process than before receiving the ion implantation.

18. The method of claim 11, further comprising:
    forming a high-k/metal gate in the gate trench.

19. A device comprising:
    a high-k/metal gate (HK/MG) over a substrate, the HK/MG comprising a first dielectric layer and an electrode disposed over the first dielectric layer;
    a spacer along a sidewall of the HK/MG;
    a second dielectric layer disposed between the spacer and the substrate directly below the spacer, wherein the first dielectric layer of the HK/MG physically contacts the second dielectric layer, the second dielectric layer being more etch resistant than the first dielectric layer; and
    a source/drain (S/D) feature beside of the HK/MG, wherein an upper portion of the S/D feature above the substrate and a lower portion of the S/D feature embedded in the substrate, wherein the second dielectric layer is disposed between the upper portion of the S/D feature and the HK/MG.

20. The device of claim 19, wherein the second dielectric layer includes silicon oxide with ion implanted species including one or more from the group consisting of carbon, boron, indium, silicon, nitrogen, helium.

* * * * *